Figure 1:
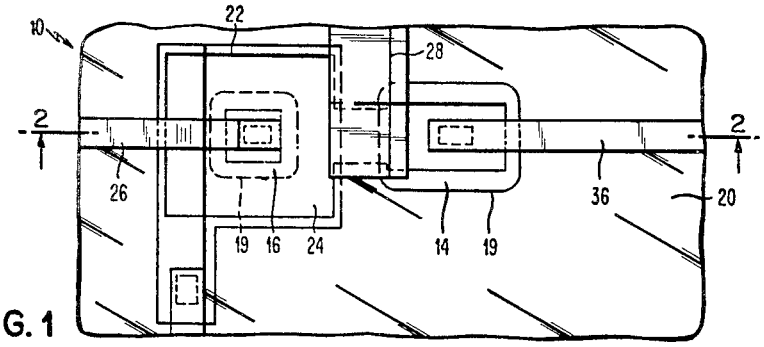
Figure 2:
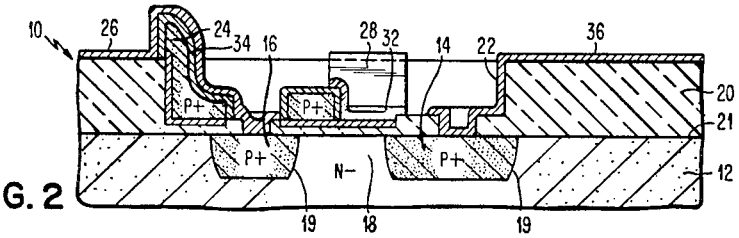
Figure 3:
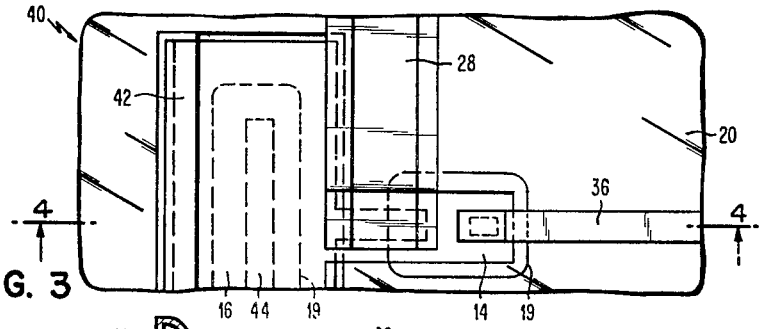
Figure 4:
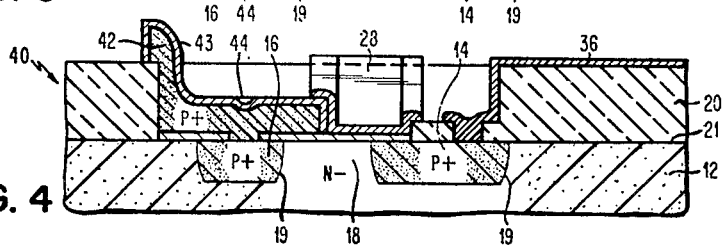

United States Defensive Publication [19] (H) [11] T964,009

Chiu et al. [43] Nov. 1, 1977

[54] HIGH VOLTAGE SEMICONDUCTOR STRUCTURE

[76] Inventors: Te-Long Chiu, 25 Hilltop Drive, Wappingers Falls, N.Y. 12950; Madhukar B. Vora, Taconic Drive, Hopewell Junction, N.Y. 12533

[21] Appl. No.: 673,510

[22] Filed: Apr. 5, 1976

Related U.S. Application Data

[63] Continuation of Ser. No. 547,912, Feb. 6, 1975, abandoned, which is a continuation of Ser. No. 361,101, May 17, 1973, abandoned.

[51] Int. Cl.[2] ..... H01L 29/78

[52] U.S. Cl. ..... 357/23; 357/53; 357/59

[57] ABSTRACT

In a field effect transistor having a semiconductor body, spaced source and drain regions, an insulating layer on the surface of the body, and an electrode to the source region, the improvement being a field shield electrode on the insulating layer overlying at least the PN junction of the drain region that terminates at the interface of the surface of the body and the insulating layer, and a gate electrode on the insulating layer over at least a portion of the channel region, the gate electrode and the field shield electrode in combination overlying all of the channel region. Another feature of the invention is a high voltage line for use on a semiconductor device consisting of a diffused region of opposite conductivity in the semiconductor body, an overlying insulating layer having an opening therein, and an overlying field shield conductive stripe that overlies the PN junction of the diffused region that terminates at the surface of the body.

1 Claim, 1 Sheet Drawing,

9 Pages Specification

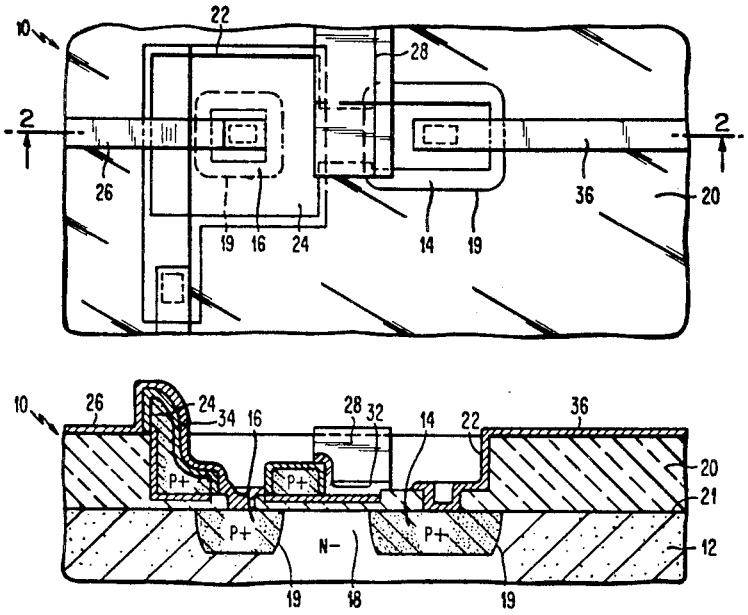

The file of this unexamined application may be inspected and copies thereof may be purchased (849 O.G. 1221, Apr. 9, 1968).